(12) United States Patent
Zhong et al.

(10) Patent No.: US 12,041,756 B2
(45) Date of Patent: Jul. 16, 2024

(54) FAN CAGE AND FAN MODULE AND ELECTRONIC DEVICE INCLUDING THE SAME

(71) Applicant: WISTRON CORP., New Taipei (TW)

(72) Inventors: Yong-Qing Zhong, New Taipei (TW); Zhao-Ping Fu, New Taipei (TW)

(73) Assignee: WISTRON CORP., New Taipei (TW)

( * ) Notice: Subject to any disclaimer, the term of this patent is extended or adjusted under 35 U.S.C. 154(b) by 105 days.

(21) Appl. No.: 18/047,681

(22) Filed: Oct. 19, 2022

(65) Prior Publication Data

US 2024/0015937 A1   Jan. 11, 2024

(30) Foreign Application Priority Data

Jul. 11, 2022   (CN) .......................... 202210808998.2

(51) Int. Cl.
*H05K 7/20* (2006.01)
*H05K 7/14* (2006.01)

(52) U.S. Cl.
CPC ....... *H05K 7/20736* (2013.01); *H05K 7/1489* (2013.01)

(58) Field of Classification Search
CPC .......................... H05K 7/20736; H05K 7/1489
See application file for complete search history.

(56) References Cited

U.S. PATENT DOCUMENTS

| | | | | |
|---|---|---|---|---|
| 10,058,006 B2 * | 8/2018 | Hung | ................... | H05K 5/0221 |
| 10,317,949 B1 * | 6/2019 | Lin | ........................ | H05K 5/023 |
| 11,378,098 B2 * | 7/2022 | Yang | ..................... | F04D 29/522 |
| 11,678,467 B2 * | 6/2023 | Gupta | ................. | H05K 7/1401 |
| | | | | 361/695 |
| 11,706,889 B1 * | 7/2023 | Zhong | ................ | H05K 7/20172 |
| | | | | 361/695 |
| 11,792,952 B2 * | 10/2023 | Mao | ...................... | H05K 7/1492 |
| | | | | 361/601 |
| 11,849,563 B2 * | 12/2023 | Zhong | ................ | H05K 7/20736 |
| 2020/0146185 A1 * | 5/2020 | Wu | ..................... | H05K 7/20172 |
| 2022/0192046 A1 * | 6/2022 | Wu | ........................ | G06F 1/188 |

* cited by examiner

*Primary Examiner* — Anthony Q Edwards
*Assistant Examiner* — Hung Q Dang
(74) *Attorney, Agent, or Firm* — McClure, Qualey & Rodack, LLP

(57) ABSTRACT

A fan cage includes a first cage part comprising a cage body and a plurality of engagement structures respectively located at different sides of an opening portion of the cage body, a second cage part located at the opening portion of the first cage part, and a latch mechanism disposed on the second cage part. The latch mechanism includes a plurality of latch components slidably disposed on the second cage part and a link component connected to the plurality of latch components. The latch components are movably connected by each other via the link component and are selectively engaged with the engagement structures of the first cage part, respectively.

20 Claims, 10 Drawing Sheets

FAN CAGE AND FAN MODULE AND ELECTRONIC DEVICE INCLUDING THE SAME

CROSS-REFERENCE TO RELATED APPLICATIONS

This non-provisional application claims priority under 35 U.S.C. § 119(a) on Patent Application No(s). 202210808998.2 filed in China on Jul. 11, 2022, the entire contents of which are hereby incorporated by reference.

TECHNICAL FIELD

The disclosure relates to a fan cage, more particularly relates to a fan cage and a fan module and an electronic device including the same.

BACKGROUND

Generally, a server or a computer host may contain one or more detachable function modules therein for the facilitation of associated maintenance or expansion works at user end. Taking a fan module as an example, most of server chassis contain one or more fan cages for accommodating one or more arrays of fans so that the fans can be arranged in a specific area of the server chassis.

To enable the placement and removal of fans into the fan cage, a typical fan cage can be separated into two pieces: a main cage member for accommodating the fan and a secondary cage member which can be assembled to the main cage member. Conventionally, the secondary cage member is assembled to the main cage member using integrally formed hooks thereon. However, such an engagement is unfavorable for performing works such as fan replacement or maintenance of components (e.g., cable or connectors) inside the main cage member, and the hooks must be deformed during the removal or installation of the secondary cage member to the main cage member and therefore are easily broken and thereby leading to permanent damage to the fan cage.

SUMMARY

Accordingly, one aspect of the disclosure is to provide a fan cage and a fan module and an electronic device which are capable of solving the aforementioned problems due to the conventional fan cage.

One embodiment of the disclosure provides a fan cage including a first cage part comprising a cage body and a plurality of engagement structures respectively located at different sides of an opening portion of the cage body, a second cage part located at the opening portion of the first cage part, and a latch mechanism disposed on the second cage part. The latch mechanism includes a plurality of latch components slidably disposed on the second cage part and a link component connected to the plurality of latch components. The plurality of latch components are movably connected by each other via the link component and are selectively engaged with the plurality of engagement structures of the first cage part, respectively.

Another embodiment of the disclosure provides a fan module including a carrier and a fan cage, the carrier includes a carrier body and a partition member, the partition member is located in the carrier body and defines a plurality of accommodation spaces within the carrier body, the fan cage is selectively accommodated in one of the accommodation spaces and includes a first cage part, a second cage part, and a latch mechanism, the first cage part includes a cage body and a plurality of engagement structures, the cage body has an opening portion, and the plurality of engagement structures are respectively located at different sides of the opening portion, the second cage part is located at the opening portion of the first cage part, the latch mechanism is disposed on the second cage part and includes a plurality of latch components slidably disposed on the second cage part and a link component connected to the plurality of latch components. The plurality of latch components are movably connected by each other via the link component and are selectively engaged with the plurality of engagement structures of the first cage part, respectively.

Another embodiment of the disclosure provides an electronic device including a chassis and a fan module, the fan module includes a carrier and a fan cage, the carrier includes a carrier body and a partition member, the carrier body is removably accommodated in the chassis, the partition member is located in the carrier body and defines a plurality of accommodation spaces within the carrier body, the fan cage is selectively accommodated in one of the accommodation spaces and includes a first cage part, a second cage part, and a latch mechanism, the first cage part includes a cage body and a plurality of engagement structures, the cage body has an opening portion, and the plurality of engagement structures are respectively located at different sides of the opening portion, the second cage part is located at the opening portion of the first cage part, the latch mechanism is disposed on the second cage part and includes a plurality of latch components slidably disposed on the second cage part and a link component connected to the plurality of latch components. The plurality of latch components are movably connected by each other via the link component and are selectively engaged with the plurality of engagement structures of the first cage part, respectively.

According to the fan cage, the fan module, and the electronic device as discussed in the above embodiments of the disclosure, the second cage part of the fan cage has the latch mechanism which includes a plurality of latch components movably connected by one another and selectively engageable with the engagement structures at different sides of the first cage part, thus the latch mechanism is able to make the second cage part assembled to or disassembled from the first cage part in an efficient and effective manner.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Aspects and advantages of the disclosure will become apparent from the following detailed descriptions with the accompanying drawings. The inclusion of such details provides a thorough understanding of the disclosure sufficient to enable one skilled in the art to practice the described embodiments but it is for the purpose of illustration only and should not be understood to limit the disclosure. On the contrary, it is intended to cover alternatives, modifications, and equivalents as can be included within the spirit and scope of the described embodiments as defined by the appended claims. To this end, those skilled in the relevant art will recognize and appreciate that many changes can be made to the various aspects of the disclosure described herein, while still obtaining the beneficial results of the present disclosure. It will also be apparent that some of the desired benefits of the present disclosure can be obtained by selecting some of the features of the present disclosure without utilizing other features.

It is to be understood that the phraseology and terminology used herein are for the purpose of better understanding the descriptions and should not be regarded as limiting. As used herein, the terms "substantially" or "approximately" may describe a slight deviation from a target value, in particular a deviation within the production accuracy and/or within the necessary accuracy, so that an effect as present with the target value is maintained. Unless specified or limited otherwise, the phrase "at least one" as used herein may mean that the quantity of the described element or component is one or more than one but does not necessarily mean that the quantity is only one. The term "and/or" may be used herein to indicate that either or both of two stated possibilities. Unless specified or limited otherwise, the terms "mounted", "connected", "disposed", "fixed", and variations thereof are used broadly and encompass both direct and indirect mounting, connection, disposing, and fixing. Further, unless specified or limited otherwise, the phrase "in fluid communication with" may be used herein to describe a situation that air is allowed to flow through at least two of spaces, areas, slots, channels, passages, and/or opening portions.

Figure 1:
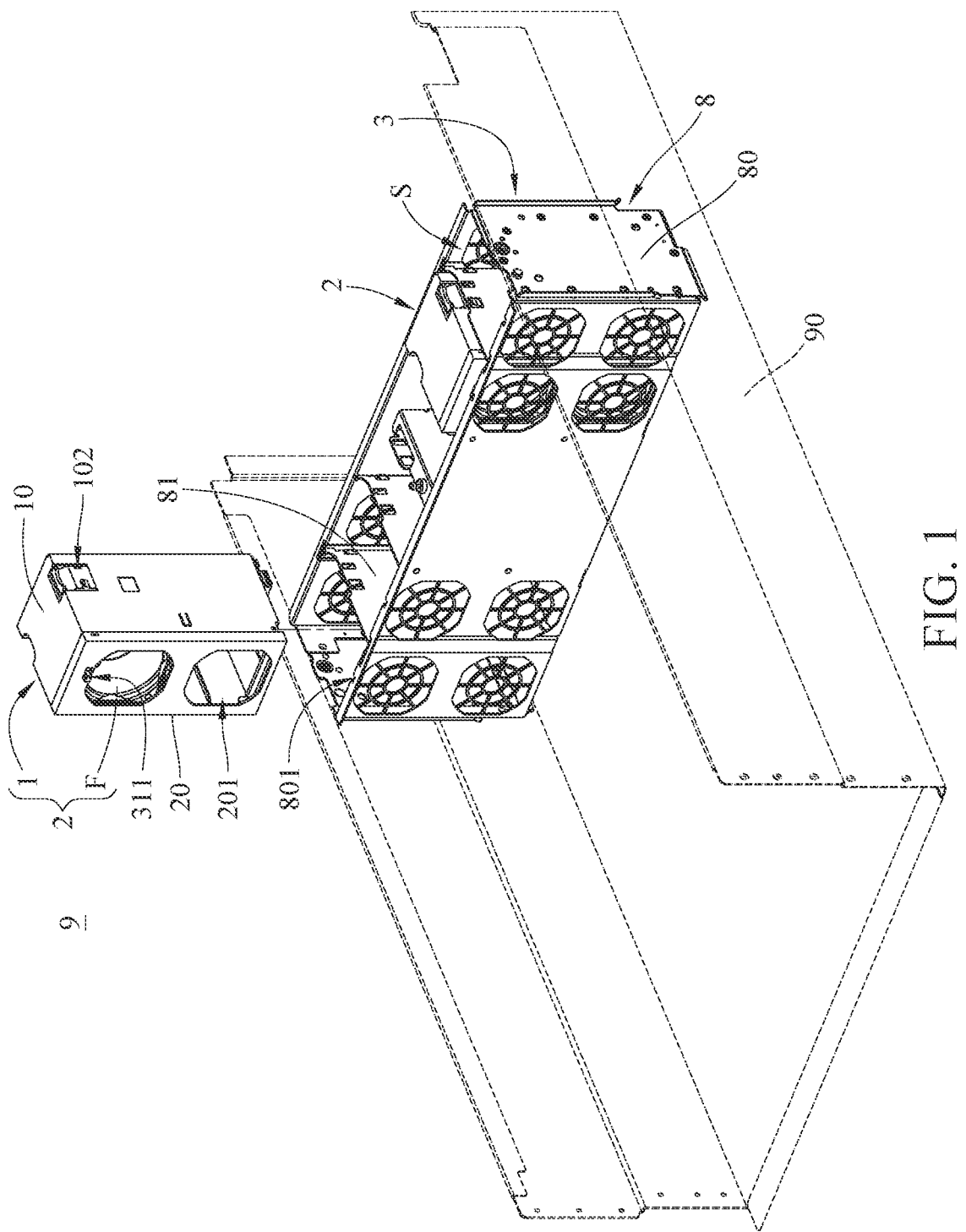
FIG. 1 is a partial perspective view of an electronic device according to one embodiment of the disclosure.

Referring to FIG. 1, one embodiment of the disclosure provides a fan cage 1, a fan set 2 including the fan cage 1, a fan module 3 including one or more fan sets 2, and an electronic device 9 including the fan module 3. The electronic device 9 may be, but is not limited to, a computer host, server host, or any part thereof. The electronic device 9 may include a chassis 90 used to support or accommodate one or more fan modules 3. The chassis may also accommodate other electrical/non-electrical component, assembly, or module or casings as required, but the disclosure is not limited thereto. The fan module 3 may include a carrier 8. The carrier 8 may include a carrier body 80 used to be removably or detachably accommodated in the chassis 90. The carrier 8 may further include at least one partition member 81 accommodated within the carrier body 80 and are spaced apart from each other so as to define the internal space of the carrier body 80 into a plurality of accommodation spaces S which are respectively suitable for accommodating the fan sets 2. For example, due to the arrangement of the partition members 81, the carrier body 80 may accommodate a plurality of fan sets 2 arranged in an array of 1×6. Note that the number of the partition members 81 in the carrier body 80 may be increased or reduced as required.

The fan set 2 may each include one fan cage 1 and at least one fan F suitably accommodated in the fan cage 1. In one embodiment, one fan cage 1 may accommodate a plurality of fans F arranged in an array of 2×1. The fan F may be, but is not limited to, any typical fan, but the disclosure is not limited by the fan F and its configuration. As shown, an array of fans F can be firmly installed in one of the accommodation spaces S defined by the carrier body 80 and the partition members 81 using the fan cage 1, such that the fans F can be arranged in the predetermined area in the chassis 90.

Figure 2:
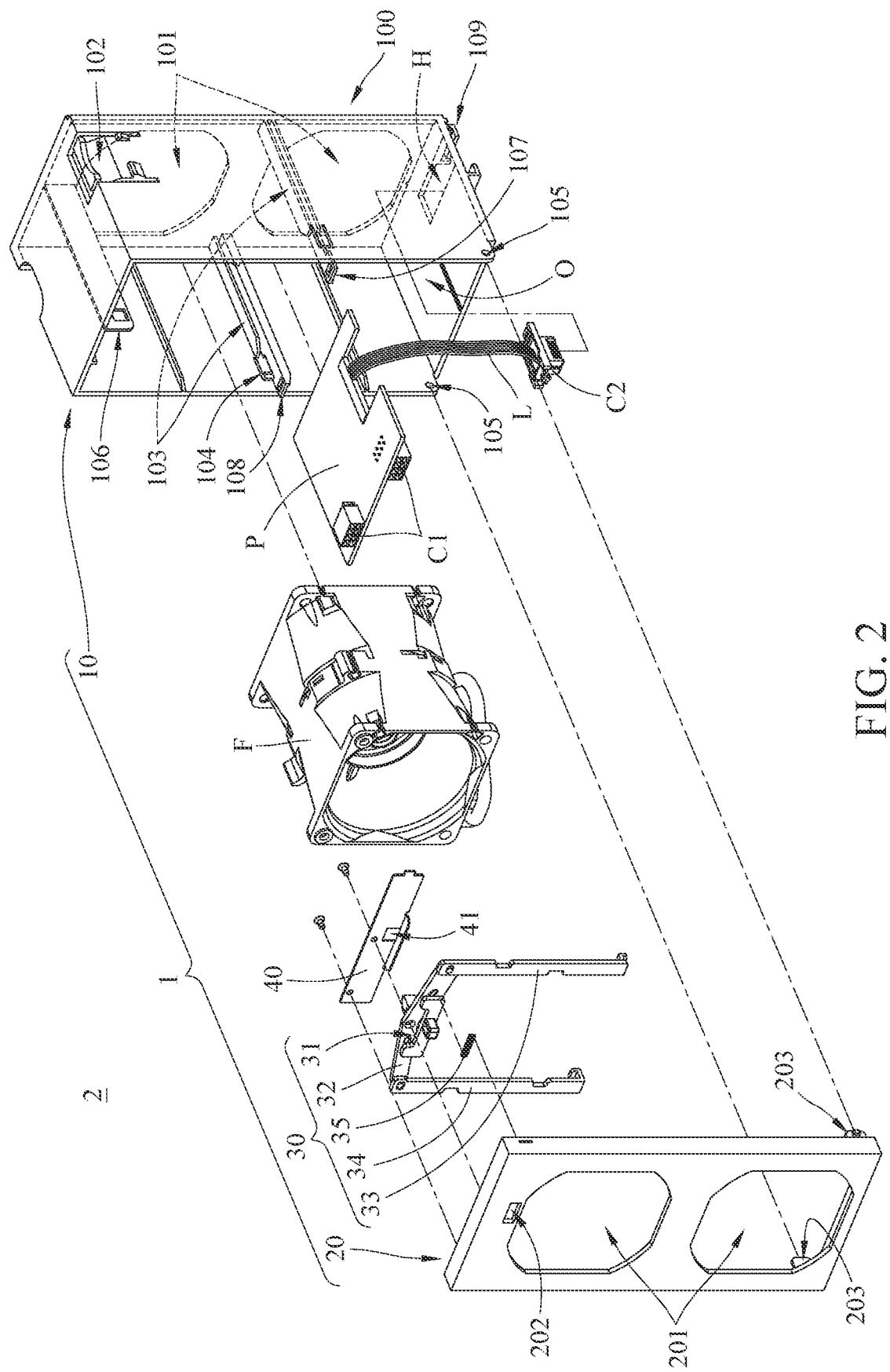
FIG. 2 is an exploded view of a fan cage of one of fan sets in FIG. 1.
Figure 3:
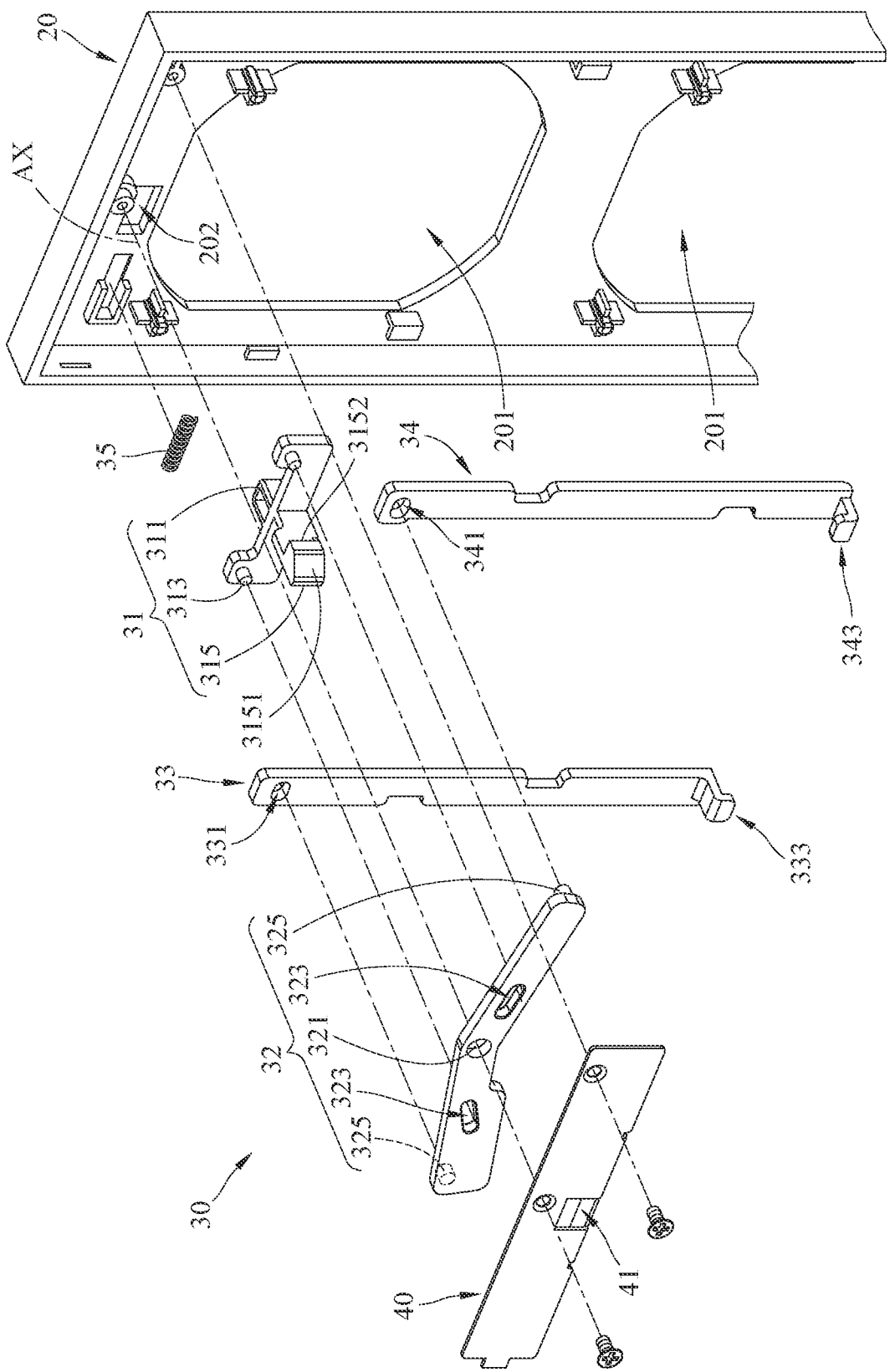
FIG. 3 is a partially exploded view of the fan cage in FIG. 2.
Figure 4:
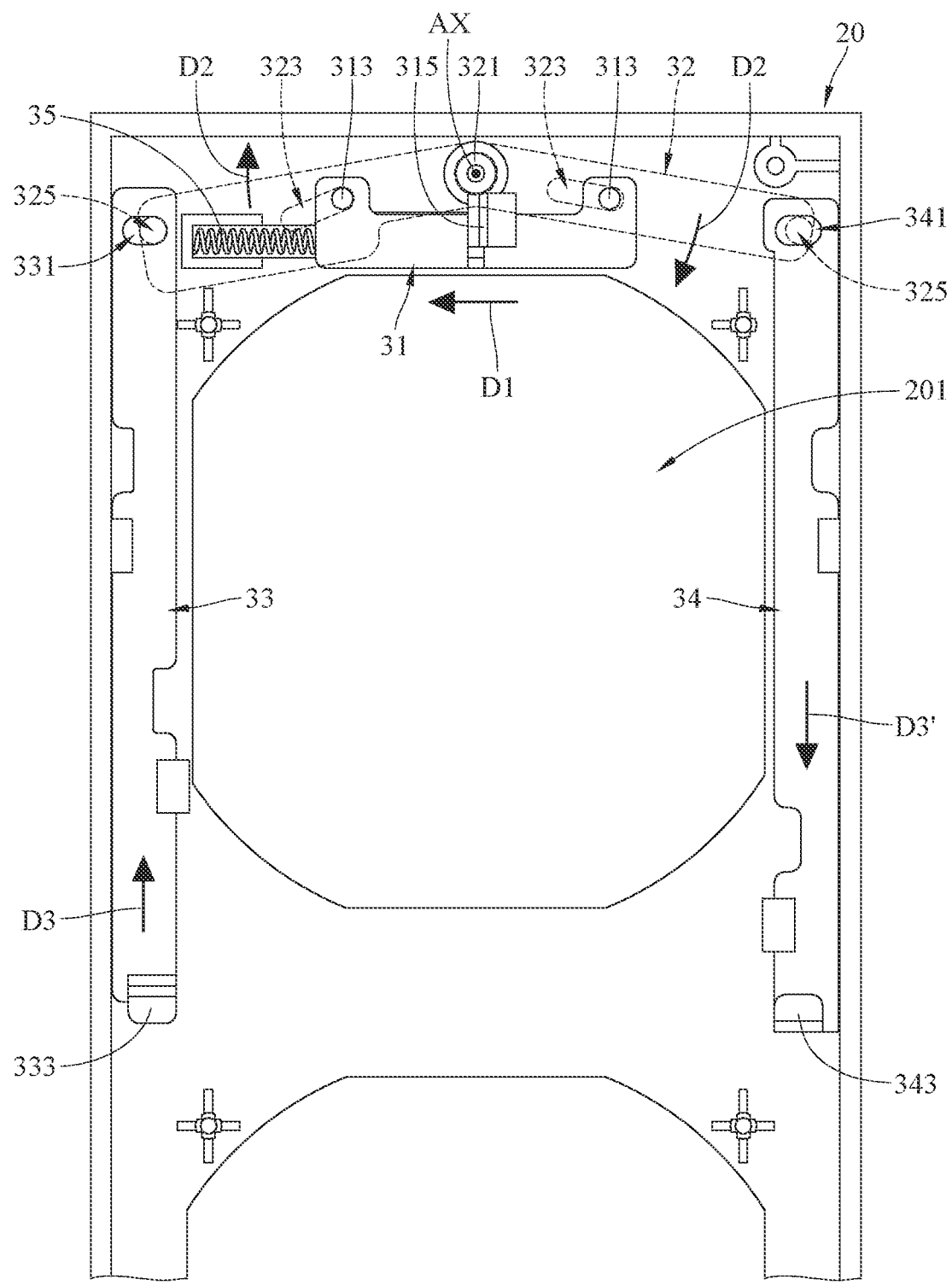
FIG. 4 depicts the inner side of a second cage part of a fan cage according to one embodiment of the disclosure.

The detail of the fan cage 1 will be described below with further reference to FIGS. 2-4. As shown, in one embodiment, the fan cage 1 may include a first cage part 10, a second cage part 20, and a latch mechanism 30. Generally, the first cage part 10 is the part of the fan cage 1 capable of accommodating one or more fans F, the second cage part 20 is the part of the fan cage 1 arranged at a side of the first cage part 10 and capable of retaining the fans F in the first cage part 10, and the latch mechanism 30 is arranged at a side of the second cage part 20 facing the first cage part 10. The second cage part 20 can be detachably attached to a side of the first cage part 10 using the latch mechanism 30.

Specifically, the first cage part 10 may include a cage body 100. The cage body 100 may be a box-like structure with opening portions at two opposite sides. As shown, the cage body 100 may have an opening portion O and one or more first ventilation holes 101, the opening portion O and the first ventilation hole 101 are respectively located at two opposite sides of the cage body 100, where the opening portion O is provided for the placement of one or more fans F into the cage body 100, and the first ventilation hole 101 may be served as an air inlet or an air outlet for the fan F accommodated in the cage body 100.

Figure 13:
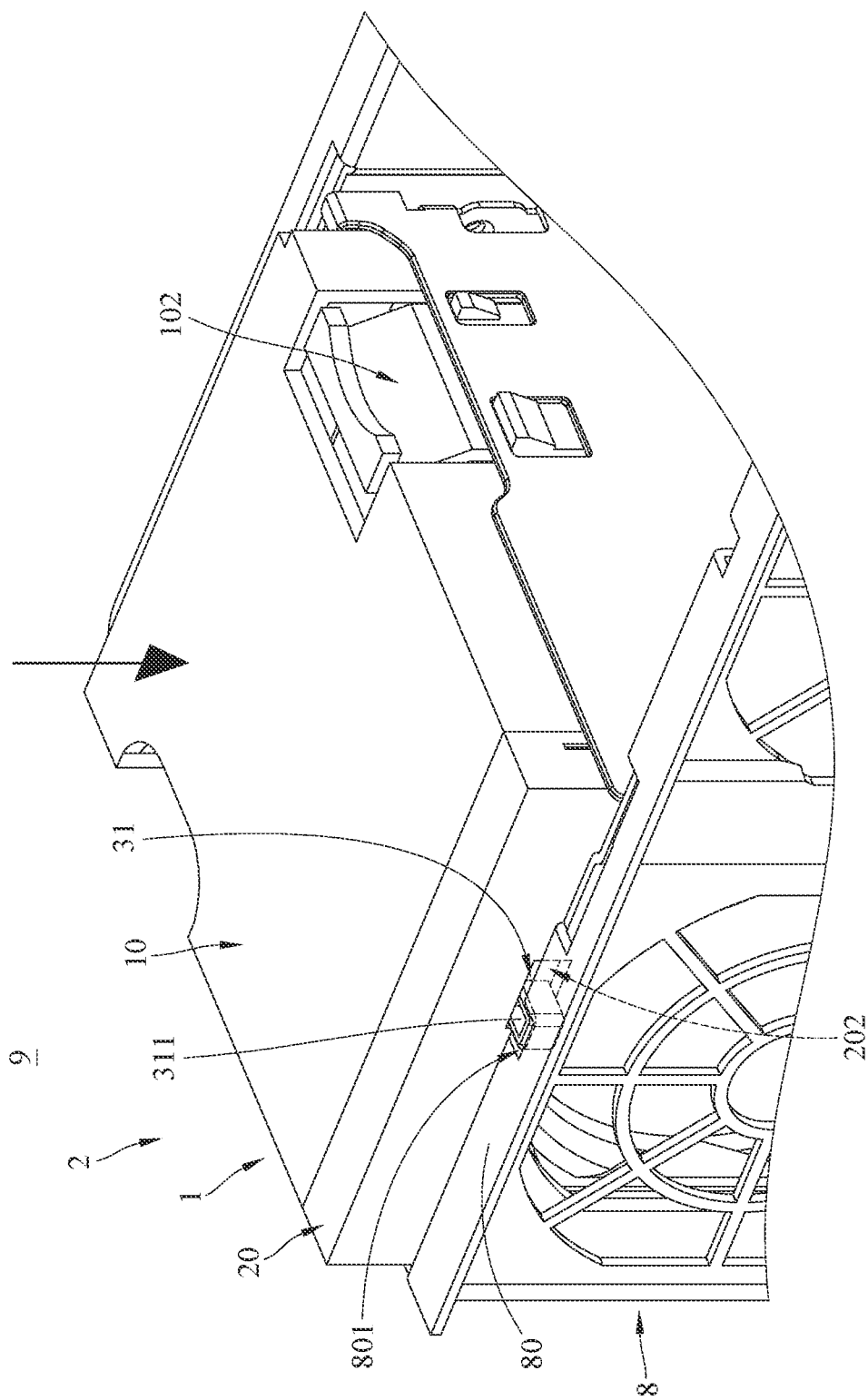
FIG. 13 is a partially enlarged view of the electronic device when a fan set according to one embodiment of the disclosure is installed into a carrier.

Optionally, there may be an elastic retaining structure 102 formed on the cage body 100 of the first cage part 10. The elastic retaining structure 102 may be arranged at a side of the cage body 100 absent of the opening portion O and the first ventilation holes 101. The elastic retaining structure 102 is able to engage with one of the adjacent partition members 81 when the fan cage 1 is in an accommodation space S of the carrier 8 (as shown in FIG. 1 or FIG. 13).

Optionally, the fan cage 1 may further include a circuit board P, the circuit board P is slidably disposed in the cage body 100 of the first cage part 10. Specifically, the cage body 100 of the first cage part 10 may have one or more rail structures 103 on inner surfaces thereof, at least part of the circuit board P can be slidably inserted into the rail structure 103, such that the circuit board P can be slid into the cage body 100 by being guided by the rail structure 103. As shown, with the support of the rail structure 103, the circuit board P can be kept in a predetermined position in the cage body 100 so as to divide the internal space of the cage body 100 into two smaller spaces respectively suitable for accommodating the fans F.

Optionally, the cage body 100 of the first cage part 10 may have one or more elastic stopping structures 104 respectively located adjacent to the rail structures 103. In one embodiment, the elastic stopping structure 104 may be located adjacent to the end of the rail structure 103 located close to the opening portion. More specifically, the elastic stopping structure 104 may be an elastic arm having one end fixed to the cage body 100 and another end being a hook shape. As such, when the circuit board P is installed in position along the rail structure 103, one end of the elastic stopping structure 104 is located at the edge of the circuit board P located close to the opening portion O so as to stop the circuit board P from moving toward the opening portion O and thereby securing the position of the circuit board P in the cage body 100.

The circuit board P is suitable to be electrically connected to the fans F. Specifically, there may be one or more first connectors C1 disposed on the circuit board P. For example, the circuit board P may have two first connectors C1 respectively disposed on two opposite surfaces of the circuit board P, the two first connectors C1 are used to be electrically connected to different fans F accommodated in the cage body 100. That is, in the cage body of this embodiment, the fan array are connected to the same circuit board. In this embodiment, the first connectors C1 may be electrically connected to a second connector C2 via a cable L of the circuit board P. The second connector C2 may be disposed at a side of the cage body 100 of the first cage part 10 and exposed from the cage body 100. For example, the second connector C2 may be detachably disposed at the bottom of the cage body 100 of the first cage part 10; specifically, the cage body 100 may have a through hole H at its bottom side, and the cage body 100 may have a holding structure 109 located at the bottom surface of the cage body 100 and located adjacent to the through hole H, the second connector C2 can be disposed through the through hole H and fixed in place by the holding structure 109. As such, when the fan cage 1 is placed into the accommodation space S of the carrier 8, the second connector C2 can be electrically connected to a corresponding connector (not shown) on the carrier 8, such that the fans F in the fan cage 1 can be electrically connected to the carrier 8 or other electronic devices in the chassis 90 through the first connectors C1, the circuit board P, and the second connector C2.

Optionally, the cage body 100 of the first cage part 10 may include one or more first coupling structures 105 and a plurality of engagement structures (e.g., a first engagement structure 106, a second engagement structure 107, and a third engagement structure 108). The first coupling structures 105, the first engagement structure 106, the second engagement structure 107, and the third engagement structure 108 may be respectively located at different sides of the opening portion O of the cage body 100. Specifically, the first coupling structures 105 may be arranged at two opposite ends of a side of the opening portion O of the cage body 100. The first coupling structures 105 may be pivotably connected to the second cage part 20. The second engagement structure 107 and the third engagement structure 108 may be located at ends of the rail structures 103 located relatively close to the opening portion O. More specifically, the second engagement structure 107 and the third engagement structure 108 may be formed on parts of the rail structure 103 extending away from the opening portion and the second engagement structure 107 and the third engagement structure 108 are respectively used to be engaged with two components (e.g., a second latch component 33 and a third latch component 34 to be described later) of the latch mechanism 30; the first engagement structure 106 may protrude from an inner surface of the cage body 100 and may be located close to the opening portion O, and the first engagement structure 106 may be used to be engaged with another component (e.g., a first latch component 31 to be described later) of the latch mechanism 30. As shown, the first coupling structures 105, the first engagement structure 106, the second engagement structure 107, and the third engagement structure 108 may be located at different sides of the opening portion, respectively.

The second cage part 20 is disposed at the opening portion O of the cage body 100 of the first cage part 10, the second cage part 20 may have one or more second ventilation holes 201. The second ventilation holes 201 may respectively correspond to the first ventilation holes 101 on the cage body 100 of the first cage part 10. As such, when the second cage part 20 is assembled to the first cage part 10, the first ventilation holes 101 and the second ventilation holes 201 may respectively correspond to an air inlet (not numbered) and an air outlet (not numbered) of the fan F to facilitate airflow caused by the fan F. In addition, the second cage part 20 may further have a through hole 202 thereon, the through hole 202 is configured for the insertion of a component (e.g., a first latch component 31 will be described later) of the latch mechanism 30 which is engageable with the first engagement structure 106.

Optionally, the second cage part 20 may further have one or more second coupling structures 203 thereon. Specifically, the second coupling structure 203 are located at two opposite corners of a side of the second cage part 20 and may be pivotably connected to the first coupling structures 105 on the cage body 100 of the first cage part 10, respectively. More specifically, one of the first coupling structure 105 and the second coupling structure 203 may be a protrusion, and the other of the first coupling structure 105 and the second coupling structure 203 may be a through hole or a blind hole configured for receiving the protrusion. The cooperation of the first coupling structures 105 and the second coupling structures 203 makes the second cage part 20 pivotably connected to a side of the cage body 100 of the first cage part 10.

The latch mechanism 30 may include a plurality of latch components (e.g., a first latch component 31, a second latch component 33, and a third latch component 34) and a link component 32 connected between and movable with these latch components. The first latch component 31, the second latch component 33, and the third latch component 34 may be arranged at different sides of the second cage part 20, respectively. As shown, the first latch component 31, the second latch component 33, and the third latch component 34 may be located at different sides of one of the second ventilation holes 201 of the second cage part respectively. For example, the first latch component 31, the second latch component 33, the third latch component 34, and the second coupling structures 203 of the second cage part may be located at different sides of the second cage part 20, respectively. Specifically, the second latch component 33 and the third latch component 34 may be arranged at two opposite sides of the second cage part 20, respectively; the first latch component 31 may be located at another side of the second cage part 20 and is connected to the second latch component 33 and the third latch component 34 via the link component 32, such that the first latch component 31, the link component 32, the second latch component 33, and the third latch component 34 are movably connected by each other.

Figure 7:
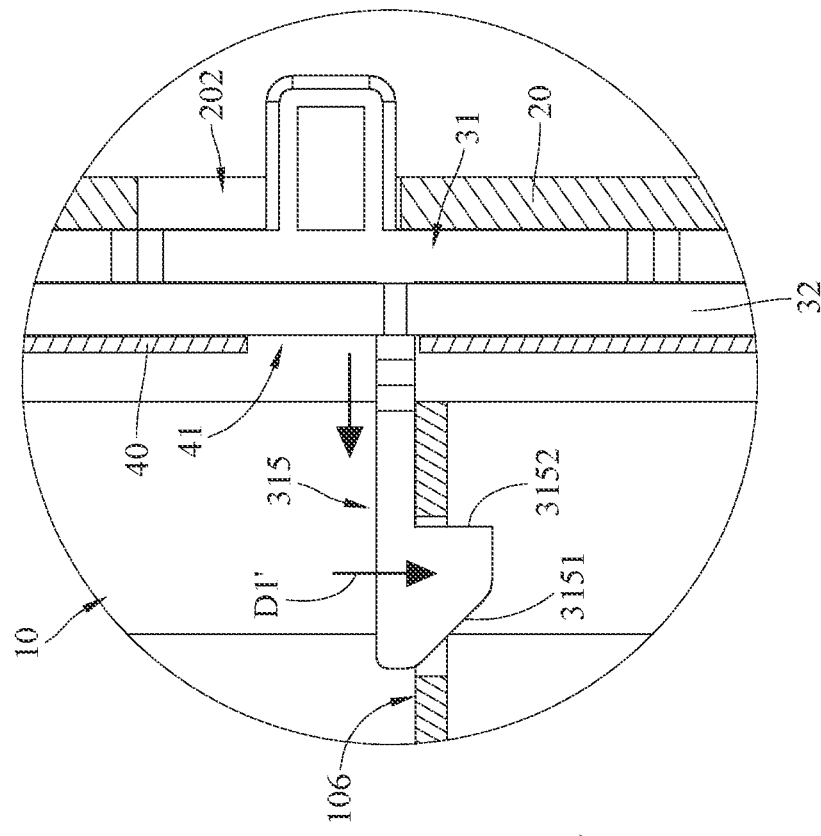
FIGS. 7-12 respectively depicts different areas of the fan cage during the installation of the second cage part.
Figure 10:
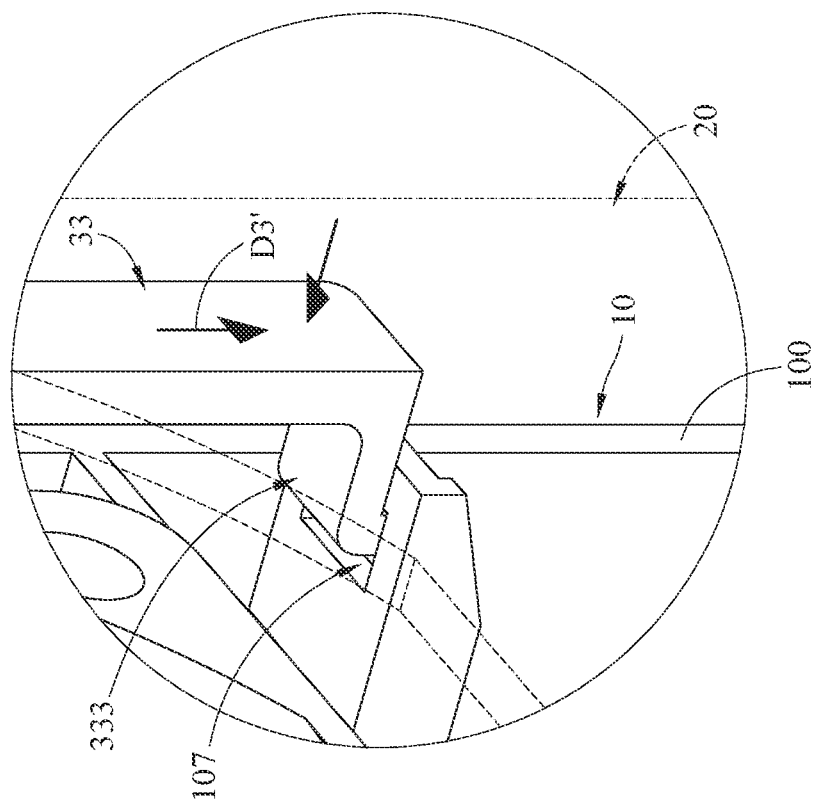

The first latch component 31 is slidably disposed on an inner surface of the second cage part 20 and located adjacent to a side of the second cage part 20 relatively located away from the second coupling structures 203. Herein, the first latch component 31 can be moved from a first engaged position (as shown in FIG. 4 or FIG. 10) to a first releasing position (as shown in FIG. 7) along a direction D1 relative to the second cage part 20. The first latch component 31 may be moved back to the first engaged position from the first releasing position along a direction opposite to the direction D1.

Optionally, the latch mechanism 30 may further include an elastic component 35, the elastic component 35 may be, but is not limited to, any suitable compression spring, the elastic component 35 may be connected between the second cage part 20 and the first latch component 31 and used to force the first latch component 31 to move toward the first engaged position. That is, the elastic component 35 is served to cause the first latch component 31 to move to the first engaged position from the first releasing position. As such, when an external force is applied to cause the first latch component 31 to move toward the first releasing position from the first engaged position along the direction D1, the elastic component 35 is deformed; when the external force is canceled, the elastic component 35 is able to automatically force the first latch component 31 to move back to the first engaged position along a direction opposite to the direction D1.

Further, in this embodiment, the latch mechanism 30 may further include an operation portion 311, the operation portion 311 may be a protrusion, which is integrally formed on the first latch component 31 or is fixed to the first latch component 31 by screw, adhesive or any other suitable manner. The operation portion 311 is disposed through the through hole 202 of the second cage part 20 and partially exposed from the second cage part 20. As such, user is allowed to switch the position of the first latch component 31 by moving the operation portion 311, thereby moving the link component 32 and the second latch component 33 and the third latch component 34 which are connected to the link component 32.

In addition, the first latch component 31 may further include at least one connection portion 313 used to be connected to the link component 32. The first latch component 31 may further include a latching portion 315 being a protrusion formed at a side of the first latch component 31 opposite to the operation portion 311 (in other words, the operation portion 311 and the latching portion 315 respectively protrude from two opposite sides of the first latch component 31), the latching portion 315 may be selectively engaged with the first engagement structure 106 on the first cage part 10. Further, the latching portion 315 may have an inclined contact surface 3151 and an engaging surface 3152, the inclined contact surface 3151 may be an inclined surface located at a side of the latching portion 315 located relatively away from the operation portion 311, the inclined contact surface 3151 is configured for the first contact with the first engagement structure 106 of the first cage part during the installation of the second cage part 20 onto the first cage part 10, the engaging surface 3152 may be a flat surface located at a side of the latching portion 315 located relatively closer to the operation portion 311, the engaging surface 3152 is used to engage with the first engagement structure 106 as the second cage part 20 is installed in position.

The link component 32 may be pivotably connected to an inner surface of the second cage part 20 and therefore is pivotable relative to the second cage part 20. The link component 32 may be movably connected to the first latch component 31 and the link component 32 and the first latch component 31 are movably connected by each other. Specifically, the link component 32 may include a coupling portion 321 pivotably connected to the second cage part 20 about an axis AX. Please see the direction D2 indicated by arrows shown in FIG. 4, the link component 32 is pivotable about the axis AX relative to the second cage part 20 so that the link component 32 is switchable between a first position (e.g., FIG. 4) and a second position (e.g., FIG. 7). Also, since the link component 32 is connected to the first latch component 31, the first latch component 31 is able to move the link component 32 at the same time. The link component 32 can be moved back to the first position from the second position along a direction opposite to the direction D2 by being forced by the first latch component 31. For example, when the first latch component 31 is forced to move toward the first releasing position from the first engaged position, the first latch component 31 causes the link component 32 to move toward the second position from the first position; when the elastic component 35 moves the first latch component 31 to the first engaged position from the first releasing position, the first latch component 31 causes the link component 32 to move to the first position from the second position.

The link component 32 may further include at least one connection portion 323 used to be connected to the connection portion 313 of the first latch component 31. Specifically, one of the connection portion 313 and the connection portion 323 may be an inclined slot or groove, and the other one of the connection portion 313 and the connection portion 323 may be a protrusion slidably disposed at the inclined slot or groove. As such, the contact force between the connection portion 313 of the first latch component 31 and the connection portion 323 of the link component 32 may cause the link component 32 to rotate about the axis AX and switch between the first position and the second position. In addition, the link component 32 may further include connection portions 325 used to be connected to the second latch component 33 and the third latch component 34.

Figure 9:
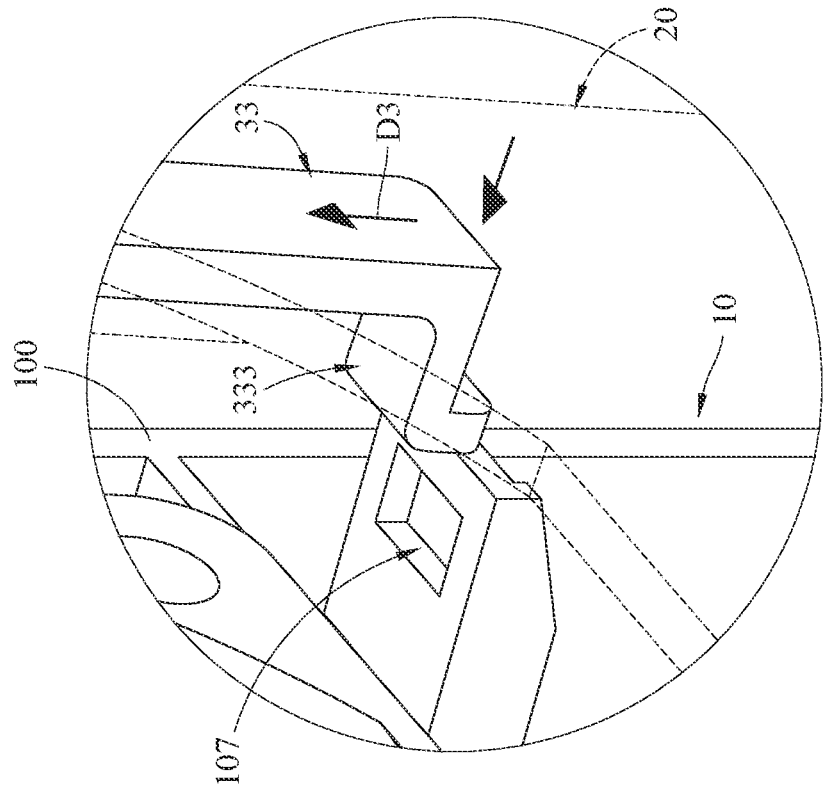

The second latch component 33 is slidably arranged at the inner surface of the second cage part 20 and connected to the link component 32 and thus the second latch component 33 and the link component 32 can be moved by each other. Herein, the second latch component 33 can be moved from a second engaged position (as shown in FIG. 4 or FIG. 10) to a second releasing position (as shown in FIG. 9) along a direction D3 which is different from the aforementioned direction D1 relative to the second cage part 20. By being forced by the link component 32, the second latch component 33 can be moved back to the second engaged position from the second releasing position along a direction D3' which is opposite to the direction D3. For example, when the first latch component 31 is forced to move toward the first releasing position from the first engaged position so as to cause the link component 32 to switch to the second position from the first position, the link component 32 moves the second latch component 33 toward the second releasing position from the second engaged position; when the elastic component 35 causes the first latch component 31 to move toward the first engaged position and thereby causing the link component 32 to move back to the first position, the link component 32 moves the second latch component 33 back to the second engaged position.

The second latch component 33 may include a connection portion 331 used to be connected to one of the connection portions 325 of the link component 32. Specifically, one of the connection portion 325 and the connection portion 331 may be a horizontal slot or groove, and the other one of the connection portion 325 and the connection portion 331 may be a protrusion slidably disposed at the horizontal slot or groove. As such, the contact force between the connection portion 325 and the connection portion 331 may cause the second latch component 33 to move in the direction D3 or the direction D3' and therefore make the second latch component 33 switchable between the second engaged position and the second releasing position.

The second latch component 33 may further include a latching portion 333 located opposite to the connection portion 331, in other words, the connection portion 331 and the latching portion 333 may be respectively located at two opposite ends of the second latch component 33. Specifically, the latching portion 333 may be a hook having a bent end extending away from the connection portion 331. When the second cage part 20 is installed on the first cage part 10, the latching portion 333 is served to be engaged with the second engagement structure 107 of the first cage part 10.

Figure 12:
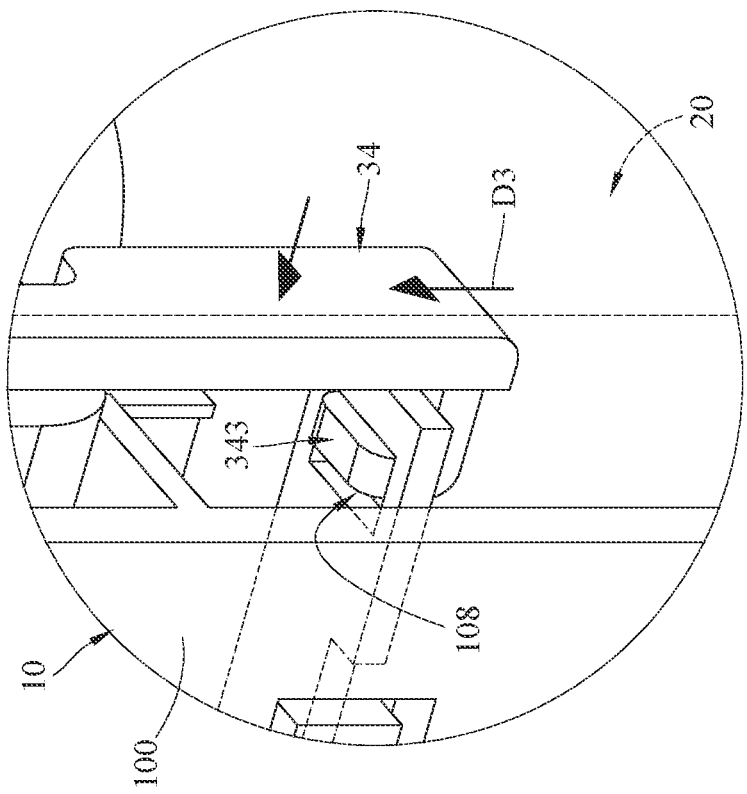
Figure 11:
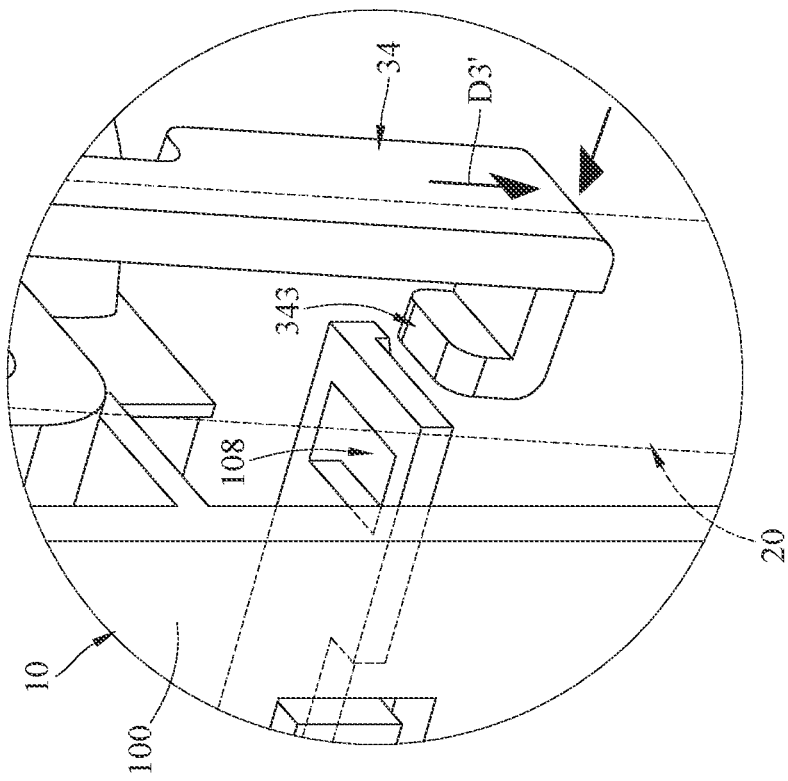

The third latch component 34 is slidably arranged at the inner surface of the second cage part 20 and connected to the link component 32 and thus the third latch component 34 and the link component 32 are movably connected by each other. It is noted that the third latch component 34 may be similar in configuration to the second latch component 33 described above, except that the movement of the third latch component 34 caused by the link component 32 is opposite to that of the second latch component 33. Herein, the third latch component 34 can be moved from a third engaged position (as shown in FIG. 4 or FIG. 12) to a third releasing position (as shown in FIG. 11) along the direction D3' relative to the second cage part 20. Since the third latch component 34 is connected to the link component 32, the link component 32 can cause the third latch component 34 to move back to the third engaged position from the third releasing position along the direction D3. For example, when the first latch component 31 is forced to move toward the first releasing position from the first engaged position so as to cause the link component 32 to switch to the second position from the first position, the link component 32 moves the third latch component 34 toward the third releasing position from the third engaged position; when the elastic component 35 causes the first latch component 31 to move toward the first engaged position and thereby causing the link component 32 to move back to the first position, the link component 32 moves the third latch component 34 back to the third engaged position.

The third latch component 34 may include a connection portion 341 used to be connected to the other connection portion 325 of the link component 32. Specifically, one of the connection portion 325 and the connection portion 341 may be a horizontal slot or groove, and the other one of the connection portion 325 and the connection portion 341 may be a protrusion slidably disposed at the horizontal slot or groove. As such, the contact force between the connection portion 325 and the connection portion 341 may cause the third latch component 34 to move in the direction D3 or the direction D3' and therefore make the third latch component 34 switchable between the third engaged position and the third releasing position.

The third latch component 34 may further include a latching portion 343 located opposite to the connection portion 341, in other words, the connection portion 341 and the latching portion 343 may be respectively located at two opposite ends of the third latch component 34. Specifically, the latching portion 343 may be a hook having a bent end extending toward the connection portion 341. When the second cage part 20 is installed on the first cage part 10, the latching portion 343 is served to be engaged with the third engagement structure 108 of the first cage part 10.

Figure 5:
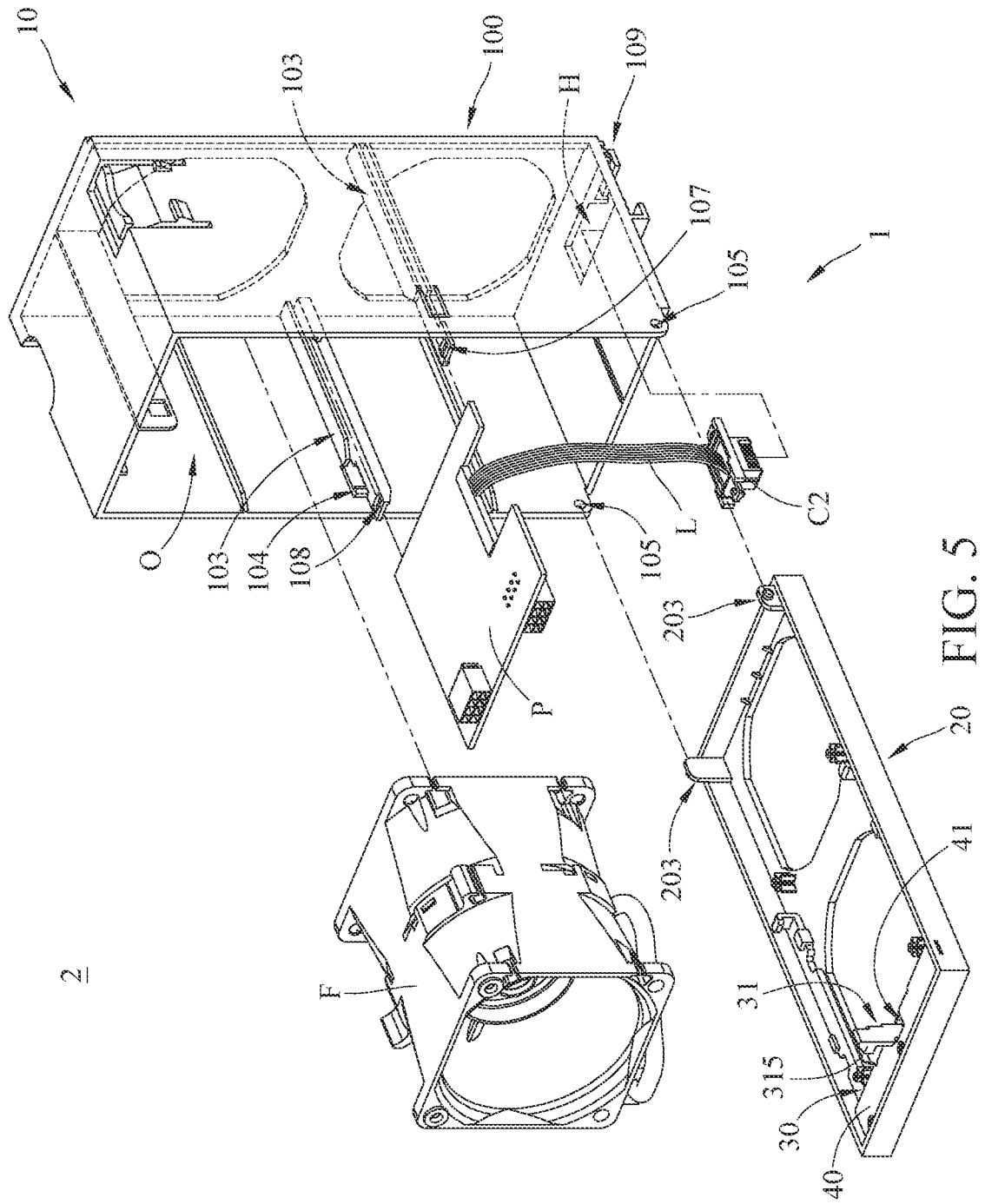
FIGS. 5-6 depicts the installation of a fan and a fan cage according to one embodiment of the disclosure.

Optionally, there may be a cover member 40 arranged at a side of the latch mechanism 30 opposite to the second cage part 20. As shown in FIG. 3 or 5, at least part of the latch mechanism 30 may be located between the cover member 40 and the second cage part 20. Specifically, the cover member 40 may at least cover the first latch component 31, the link component 32, and the parts of the second latch component 33 and the third latch component 34 that overlap with the link component 32. As such, the cover member 40 is able to protect the connections among the first latch component 31, the link component 32, the second latch component 33, and the third latch component 34. Further, the cover member 40 may have a through hole 41. The latching portion 315 of the first latch component 31 penetrates through the through hole 41.

Then, please further refer to FIG. 5. The installation of a fan F into the fan cage 1 may be achieved by the following steps. Firstly, the circuit board P may be inserted into the cage body 100 of the first cage part 10 along the rail structure 103. When the circuit board P is moved to a predetermined position, the edge of the circuit board P located close to the opening portion O of the first cage part 10 will be held by the elastic stopping structure 104 so that the circuit board P is kept in the cage body 100. Then, the second connector C2 connected to the circuit board P is moved through the through hole H on the bottom of the cage body 100 and engaged with the holding structure 109, such that the second connector C2 is fixed at a side of the cage body 100 and exposed to outside. Then, the fan F may be selectively placed into one of the spaces defined by the circuit board P and the inner surfaces of the cage body 100, and the fan F can be connected to one of the first connectors C1 on the circuit board P and therefore is electrically connected to the second connector C2. Then, the second coupling structures 203 of the second cage part 20 may be connected to the first coupling structures 105 of the cage body 100 so that the second cage part 20 will be pivotably disposed on the first cage part 10.

Figure 6:
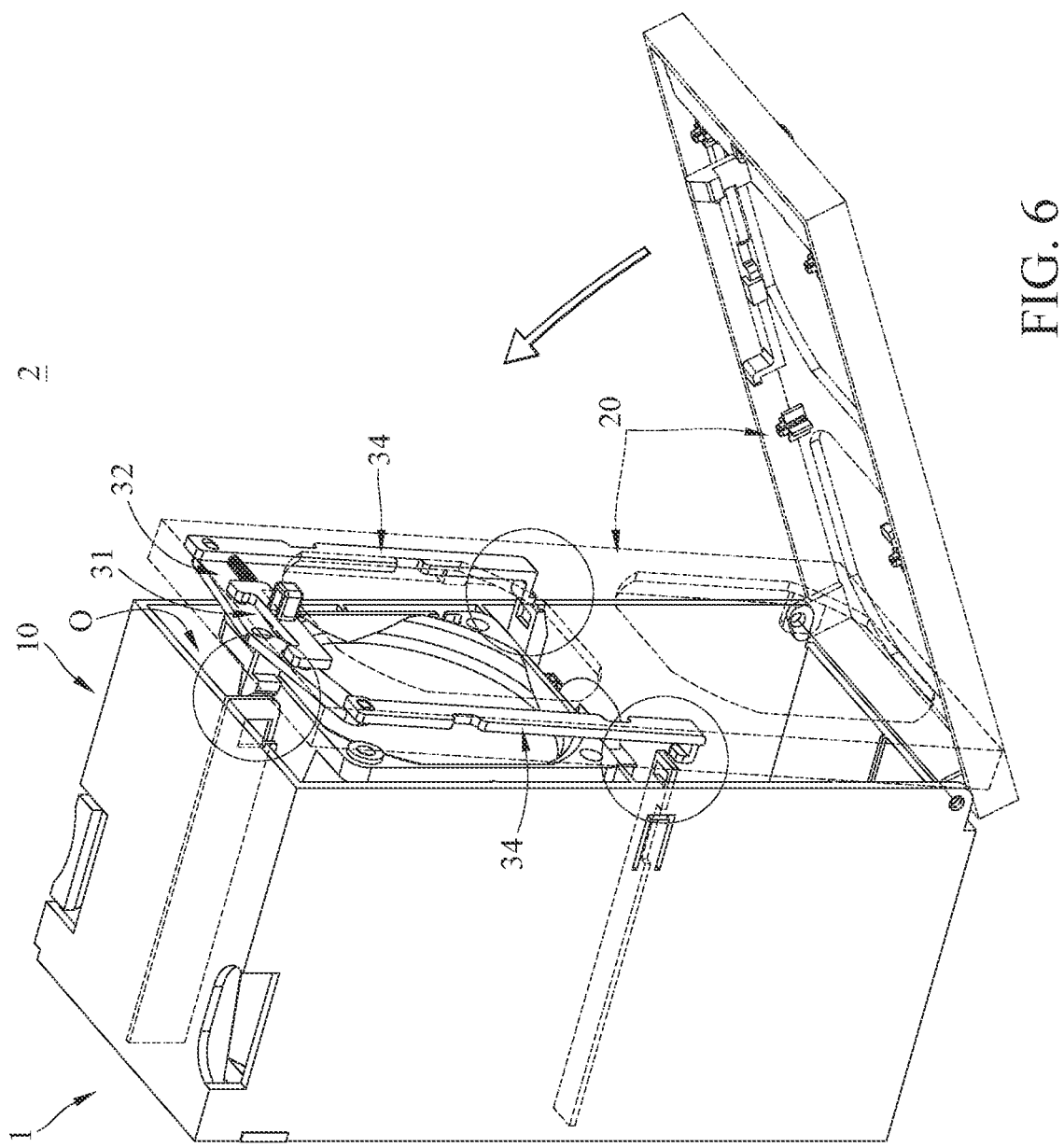

Then, please refer to FIG. 6, by pivoting the second cage part 20 along the direction indicated by the arrow, the first latch component 31, the second latch component 33, and the third latch component 34 of the latch mechanism 30 will respectively be engaged with the first engagement structure 106, the second engagement structure 107, and the third engagement structure 108 on the cage body 100.

During the aforementioned motion of the second cage part 20, the inclined contact surface 3151 of the latching portion 315 of the first latch component 31 will contact the first engagement structure 106 and thereby forcing the first latch component 31 to move toward the first releasing position from the first engaged position (as indicated by the direction D1 in FIG. 7).

As discussed above, when the first latch component 31 is forced to move to the first releasing position from the first engaged position, the first latch component 31 will move the link component 32 to the second position from the first position and thereby switching the second latch component 33 to the second releasing position from the second engaged position (as indicated by the direction D3 in FIG. 9) and switching the third latch component 34 to the third releasing position from the third engaged position (as indicated by the direction D3' in FIG. 11). Thus, as shown in FIG. 9 and FIG. 11, the second latch component 33 and the third latch component 34 are respectively moved away from the second engagement structure 107 and the third engagement structure 108 and therefore are prevented from interfering or hitting the first cage part 10 while the second cage part 20 is approaching the first cage part 10.

Figure 8:
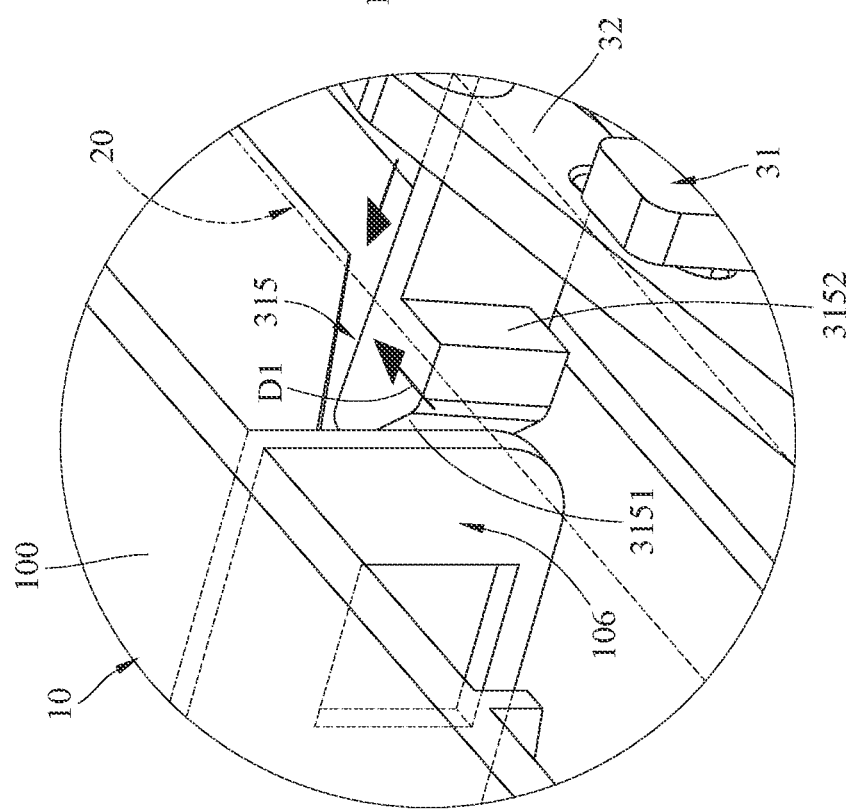

Then, when the second cage part 20 reaches its predetermined position to become parallel to the first cage part 10, the first latch component 31, the second latch component 33, and the third latch component 34 will automatically restore to their original positions and therefore respectively engage with the first engagement structure 106, the second engagement structure 107, and the third engagement structure 108 of the first cage part 10. Specifically, as shown in FIGS. 7-8, when the inclined contact surface 3151 of the latching portion 315 of the first latch component 31 slides over the first engagement structure 106 of the first cage part 10, the first latch component 31 moves back to the first engaged position along the direction D1' and therefore making the engaging surface 3152 of the latching portion 315 engage with the first engagement structure 106.

As discussed above, when the first latch component 31 is moved back to the first engaged position by being forced by the elastic component 35, the first latch component 31 will simultaneously move the link component 32 back to the first position. As such, the second latch component 33 is simultaneously moved back to the second engaged position along the direction D3' to make its latching portion 333 engage with the second engagement structure 107 of the first cage part 10 (as shown in FIG. 10) and the third latch component 34 is simultaneously moved back to the third engaged position along the direction D3 to make its latching portion 343 engage with the third engagement structure 108 of the first cage part 10 (as shown in FIG. 12).

In short, when the latching portion 315 of the first latch component 31 is engaged with the first engagement structure 106 of the first cage part 10, the latching portion 333 of the second latch component 33 and the latching portion 343 of the third latch component 34 will respectively engage with the second engagement structure 107 and the third engagement structure 108 of the first cage part 10 at the same time and thereby completing the installation of the fan F to the fan cage 1.

Then, as shown in FIG. 13, the assembly (i.e., the fan set 2) that having the fan cage 1 and the fan F therein may be selectively placed into one of the accommodation spaces S of the carrier 8. By doing so, the fan F or the array of the fans F can be arranged in a predetermined area of the chassis 90 via the carrier 8. During the placement of the fan cage 1 into the carrier 8, the elastic retaining structure 102 of the first cage part 10 will engage with one of the partition members 81 so as to secure the position of the fan cage 1 relative to the carrier 8. Meanwhile, the operation portion 311 of the first latch component 31 which sticks out of the through hole 202 of the second cage part 20 is located in one of positioning recesses 801 on the carrier body 80 of the carrier 8. The positioning recess 801 is able to protect the operation portion 311 and also able to limit the fan cage 1 from moving relative to the carrier 8 by restricting the operation portion 311. In addition, the second connector C2 which is connected to the circuit board P can be connected to a mating connector (not shown) on the carrier 8 or the chassis 90 when the fan cage 1 is installed in the carrier 8, such that the fan F being accommodated within the fan cage 1 can be electrically connected to the electronic device or component on the carrier 8 or the chassis 90 by the installation of the fan cage 1.

It is understandably that the removal of the fan F can be achieved by reversely performing the aforementioned steps. For example, the user can apply force to make the elastic retaining structure 102 release the partition member 81 of the carrier 8, such that the fan cage 1 is removable from the carrier 8; then, the user can move the first latch component 31 toward the first releasing position by moving its operation portion 311, by doing so, the latching portion 315 of the first latch component 31 is disengaged from the first engagement structure 106 of the first cage part 10, and the second latch component 33 and the third latch component 34 are simultaneously disengaged from the second engagement structure 107 and third engagement structure 108 of the first cage part 10 by the first latch component 31. As such, the engagement of the latch mechanism 30 with the first cage part 10 is canceled so that the second cage part 20 becomes pivotable relative to the first cage part 10, thus the second cage part 20 can be laid down to enable the removal of the fan F out of the first cage part 10.

As the fan cage 1 discussed above, after the placement of the fan F into the first cage part 10, the installation of the fan F can be simply completed by close the second cage part 20. On the other hand, the limitation of the second cage part 20 to the fan F can be simply canceled by operating the first latch component 31 of the latch mechanism 30. In short, the fan cage 1 enables an easy and efficient installation and removal of the second cage part 20 relative to the first cage part 10, which prevent the problems that the conventional fan cage being assembled using integrally formed hooks is easily cause the hooks to break during the assembly and disassembly processes. Accordingly, the fan cage 1 is more durable and reliable in terms of maintenance works.

In addition, as discussed above, the fan cage 1 offers the first connectors C1 individually for electrically connecting to different fans F therein, thus the fan cage 1 permits the individual installation and removal of the fan F and thereby facilitating the maintenance works for specific fan F.

Also, since the fan cage 1 has the elastic retaining structure 102 engageable with the carrier 8 and the operation portion 311 which can be positioned by the positioning recess 801 of the carrier 8, the fan cage 1 and the device or component (e.g., the fan F) inside the fan cage 1 can be stably held in position and prevented from being affected by the impact or external force due to transportation or drop test.

According to the fan cage, the fan module, and the electronic device as discussed in the above embodiments of the disclosure, the second cage part of the fan cage has the latch mechanism which includes a plurality of latch components movably connected by one another and selectively engageable with the engagement structures at different sides of the first cage part, thus the latch mechanism is able to make the second cage part assembled to or disassembled from the first cage part in an efficient and effective manner, thereby preventing the problems that the conventional fan cage being assembled using integrally formed hooks is easily cause the hooks to break during the assembly and disassembly processes. As such, the fan cage of the above embodiments of the disclosure is more durable, reliable, and easy-to-use compared to the convention fan cage.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:
1. A fan cage, comprising:
   a first cage part comprising a cage body and a plurality of engagement structures respectively located at different sides of an opening portion of the cage body;
   a second cage part removably located at the opening portion of the first cage part; and
   a latch mechanism disposed on the second cage part and comprising:
   a plurality of latch components slidably disposed on the second cage part; and a link component connected to the plurality of latch components;
wherein the plurality of latch components are movably connected to each other via the link component to engage with the plurality of engagement structures of the first cage part, respectively.

2. The fan cage according to claim 1, wherein the link component is pivotably connected to the second cage part, the plurality of latch components comprises a first latch component and a second latch component, the first latch component is slidably disposed on the second cage part and is connected to the second latch component via the link component, the plurality of engagement structures comprises a first engagement structure and a second engagement structure, the first latch component is engaged with the first engagement structure, and the second latch component is engaged with the second engagement structure.

3. The fan cage according to claim 2, wherein the plurality of latch components further comprises a third latch component, the first latch component is connected to the third latch component via the link component, the plurality of engagement structures further comprises a third engagement structure, and the third latch component is engaged with the third engagement structure.

4. The fan cage according to claim 3, wherein the second latch component and the third latch component are respectively moved in different directions and respectively disengaged from the second engagement structure and the third engagement structure when the first latch component is disengaged from the first engagement structure.

5. The fan cage according to claim 4, further comprising an elastic component connected between the second cage part and the first latch component.

6. The fan cage according to claim 1, wherein the second cage part has a through hole, the latch mechanism comprises an operation portion disposed on one of the latch components and disposed through the through hole, and the operation portion exposed from the second cage part.

7. The fan cage according to claim 1, wherein the cage body of the first cage part has a rail structure, and a circuit board slidably disposed on the cage body via the rail structure.

8. The fan cage according to claim 7, wherein the cage body of the first cage part has an elastic stopping structure located adjacent to the rail structure, the circuit board is stopped from moving toward the opening portion of the cage body by the elastic stopping structure.

9. The fan cage according to claim 1, wherein the cage body of the first cage part comprises a plurality of first coupling structures, the plurality of first coupling structures and the plurality of engagement structures are respectively located at different sides of the opening portion, the second cage part comprises a plurality of second coupling structures, the plurality of second coupling structures and the plurality of latch components are respectively located at different sides of the second cage part, the plurality of first coupling structures are respectively pivotably connected to the plurality of second coupling structures.

10. A fan module, comprising:
a carrier comprising a carrier body and a partition member located in the carrier body and defining a plurality of accommodation spaces within the carrier body; and
a fan cage selectively accommodated in one of the accommodation spaces and comprising:
a first cage part comprising a cage body and a plurality of engagement structures respectively located at different sides of an opening portion of the cage body;
a second cage part removably located at the opening portion of the first cage part; and
a latch mechanism disposed on the second cage part and comprising:
a plurality of latch components slidably disposed on the second cage part; and
a link component connected to the plurality of latch components;
wherein the plurality of latch components are movably connected by each other via the link component to engage with the plurality of engagement structures of the first cage part, respectively.

11. The fan module according to claim 10, wherein the link component is pivotably connected to the second cage part, the plurality of latch components comprises a first latch component and a second latch component, the first latch component is slidably disposed on the second cage part and is connected to the second latch component via the link component, the plurality of engagement structures comprises a first engagement structure and a second engagement structure, the first latch component is engaged with the first engagement structure, and the second latch component is engaged with the second engagement structure.

12. The fan module according to claim 11, wherein the plurality of latch components further comprises a third latch component, the first latch component is connected to the third latch component via the link component, the plurality of engagement structures further comprises a third engagement structure, and the third latch component is engaged with the third engagement structure.

13. The fan module according to claim 12, wherein the second latch component and the third latch component are respectively moved in different directions and respectively disengaged from the second engagement structure and the third engagement structure when the first latch component is disengaged from the first engagement structure.

14. The fan module according to claim 13, wherein the fan cage further comprises an elastic component connected between the second cage part and the first latch component.

15. The fan module according to claim 10, wherein the second cage part has a through hole, the latch mechanism comprises an operation portion disposed on one of the latch components and disposed through the through hole, and the operation portion exposed from the second cage part.

16. The fan module according to claim 15, wherein a part of the operation portion which protrudes the through hole of the second cage part is accommodated in a positioning recess of the carrier body.

17. The fan module according to claim 10, wherein the fan cage further comprises a circuit board, the cage body of the first cage part has a rail structure, the circuit board is slidably disposed on the rail structure, each of two first connectors respectively disposed on each of two opposite surfaces of the circuit board, the two first connectors are electrically connected to a second connector disposed on the cage body of the first cage part via a cable of the circuit board.

18. The fan module according to claim 17, wherein the cage body of the first cage part has an elastic stopping structure located adjacent to the rail structure, the circuit board is stopped from moving toward the opening portion of the cage body by the elastic stopping structure.

19. The fan module according to claim 10, wherein the cage body of the first cage part comprises a plurality of first coupling structures, the plurality of first coupling structures and the plurality of engagement structures are respectively located at different sides of the opening portion, the second cage part comprises a plurality of second coupling structures, the plurality of second coupling structures and the plurality of latch components are respectively located at different sides of the second cage part, the plurality of first coupling structures are respectively pivotably connected to the plurality of second coupling structures.

20. An electronic device, comprising:
a chassis; and
a fan module comprising:
a carrier comprising a carrier body and a partition member, wherein the carrier body is removably accommodated in the chassis, and the partition member is located in the carrier body and defines a plurality of accommodation spaces within the carrier body; and
a fan cage selectively accommodated in one of the accommodation spaces, the fan cage comprising:
a first cage part comprising a cage body and a plurality of engagement structures respectively located at different sides of an opening portion of the cage body;
a second cage part removably located at the opening portion of the first cage part; and
a latch mechanism disposed on the second cage part and comprising:
a plurality of latch components slidably disposed on the second cage part; and
a link component connected to the plurality of latch components;
wherein the plurality of latch components are movably connected by each other via the link component to engage with the plurality of engagement structures of the first cage part, respectively.

* * * * *